United States Patent
Choi et al.

(10) Patent No.: US 11,469,385 B2
(45) Date of Patent: Oct. 11, 2022

(54) FLEXIBLE DISPLAY AND METHOD OF MANUFACTURING THE SAME

(71) Applicant: SAMSUNG DISPLAY CO., LTD., Yongin-si (KR)

(72) Inventors: Jinhwan Choi, Yongin-si (KR); Kihyun Kim, Yongin-si (KR); Taean Seo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 235 days.

(21) Appl. No.: 16/795,244

(22) Filed: Feb. 19, 2020

(65) Prior Publication Data

US 2020/0203643 A1 Jun. 25, 2020

Related U.S. Application Data

(62) Division of application No. 15/226,754, filed on Aug. 2, 2016, now abandoned.

(30) Foreign Application Priority Data

Aug. 11, 2015 (KR) .......................... 10-2015-0113370

(51) Int. Cl.
| | | |
|---|---|---|
| *H01L 21/00* | (2006.01) | |
| *H01L 51/00* | (2006.01) | |
| *H01L 21/02* | (2006.01) | |
| *H01L 27/32* | (2006.01) | |

(52) U.S. Cl.
CPC .... *H01L 51/0097* (2013.01); *H01L 21/02118* (2013.01); *H01L 27/3244* (2013.01); *H01L 2227/326* (2013.01); *Y02E 10/549* (2013.01); *Y02P 70/50* (2015.11)

(58) Field of Classification Search
CPC ........... H01L 2227/326; H01L 27/3244; H01L 51/0097
See application file for complete search history.

(56) References Cited

U.S. PATENT DOCUMENTS

| | | | | |
|---|---|---|---|---|
| 4,826,297 A | * | 5/1989 | Kubo | .................. G02F 1/13452 349/122 |
| 2003/0034497 A1 | | 2/2003 | Yamazaki et al. | |
| 2004/0087110 A1 | | 5/2004 | Takayama et al. | |

(Continued)

FOREIGN PATENT DOCUMENTS

| | | |
|---|---|---|
| JP | 2005-033219 | 2/2005 |
| JP | 2013-153177 | 8/2013 |

(Continued)

*Primary Examiner* — Meiya Li
(74) *Attorney, Agent, or Firm* — F. Chau & Associates, LLC (57) ABSTRACT

A flexible display and a method of manufacturing the same are disclosed. In one aspect, the method includes forming a sacrificial metal layer over a support substrate, the sacrificial metal layer formed of a metal material, and forming a barrier layer over the sacrificial metal layer, the barrier layer formed of an organic material. The method also includes exposing the sacrificial metal layer to oxygen so as to form a sacrificial metal oxide layer, forming a display unit over the barrier layer, and separating the barrier layer from the support substrate.

11 Claims, 6 Drawing Sheets

(56) References Cited

U.S. PATENT DOCUMENTS

| | | | |
|---|---|---|---|
| 2004/0232413 A1* | 11/2004 | Yamazaki | H01L 27/3244 |
| | | | 438/149 |
| 2008/0316410 A1 | 12/2008 | Fujii et al. | |
| 2009/0004772 A1* | 1/2009 | Jinbo | H01L 29/7869 |
| | | | 257/E51.024 |
| 2010/0148209 A1* | 6/2010 | Hatano | H01L 33/62 |
| | | | 257/E33.053 |
| 2014/0354617 A1 | 12/2014 | Nam et al. | |
| 2015/0349294 A1 | 12/2015 | Lee et al. | |
| 2017/0047848 A1 | 2/2017 | Choi et al. | |

FOREIGN PATENT DOCUMENTS

| | | |
|---|---|---|
| KR | 1020060019821 | 3/2006 |
| KR | 1020090009335 | 1/2009 |
| KR | 1020110042899 | 4/2011 |
| KR | 10-2014-0041655 | 4/2014 |
| KR | 10-2014-0141843 | 12/2014 |

\* cited by examiner

FLEXIBLE DISPLAY AND METHOD OF MANUFACTURING THE SAME

CROSS-REFERENCE TO RELATED APPLICATIONS

This application is a divisional of U.S. application Ser. No. 15/226,754, filed on Aug. 2, 2016 in the U.S. Patent and Trademark Office, which claims the benefit of Korean Patent Application No. 10-2015-0113370, filed on Aug. 11, 2015 in the Korean Intellectual Property Office, the disclosures of both of which are incorporated herein in their entireties by reference.

BACKGROUND

Technical Field

The described technology generally relates to a flexible display and a method of manufacturing the same.

Discussion of the Related Technology

From among display devices, an organic light-emitting diode (OLED) display has drawn attention as a next-generation display apparatus due to its desirable characteristics including a wide viewing angle, a high contrast ratio, and a rapid response rate.

Generally, when the OLED display is manufactured, thin-film transistors (TFTs) and OLEDs are formed on a substrate, and the OLEDs emit light during operation of the OLED technology can be applied to a small device such as a cellular phone or a large product such as a TV.

Recently, market demand for flexible display apparatuses has increased, and research on flexible display apparatuses is being actively performed.

The above information disclosed in this Background section is only for understanding the background of the described technology, and therefore, it may contain information that does not constitute the prior art that is already known to the public in this country.

SUMMARY

One inventive aspect is a flexible display and a method of manufacturing the same, where the flexible display includes a display unit in which damage is minimized caused by heat or a crack when a flexible substrate is delaminated from a support substrate.

Another aspect is a flexible display apparatus, in which a damage of a display unit, which is caused by heat or a crack generated in a process of manufacturing the flexible display apparatus, is reduced and a method of manufacturing the same, so as to solve problems including the problem described above. However, this is only an example, and does not pose a limitation on the scope of the described technology.

Another aspect is a method of manufacturing a flexible display apparatus that includes: forming a sacrificial metal layer on a support substrate, the sacrificial metal layer including a metal material; forming a barrier layer on the sacrificial metal layer, the barrier layer including an organic material; forming a sacrificial metal oxide layer by exposing the sacrificial metal layer to oxygen; forming a display unit on the barrier layer; and separating the barrier layer from the support substrate.

The organic material may be formed of a material having a low viscosity greater than about 1 centipoise (cP) and equal to or less than about 100 cP.

The barrier layer may be formed of an imide-based, acrylic-based, phenylene-based, or siloxane-based material.

The barrier layer may be formed to have a thickness equal to or greater than about 10 nm and equal to or less than about 1 μm.

The sacrificial metal layer may include molybdenum (Mo).

The barrier layer may include the organic material and a solvent, and the method may further include vaporizing the solvent from the barrier layer at same time when the sacrificial metal oxide layer is formed.

The barrier layer may include the organic material and a cross-linking agent, and the method may further include cross-linking the barrier layer with the cross-linking agent by exposing the barrier layer to heat at same time when the sacrificial metal oxide layer is formed.

The separating of the barrier layer from the support substrate may include separating the barrier layer from the support substrate by radiating a laser light to the sacrificial metal oxide layer.

The separating of the barrier layer from the support substrate may include separating the barrier layer from the support substrate by dissolving the sacrificial metal oxide layer in water.

The forming of the sacrificial metal oxide layer may be performed after the barrier layer is formed.

Another aspect is a flexible display apparatus that includes: a barrier layer including a low-viscosity organic material; and a display unit on the barrier layer and including a thin-film transistor and a light-emitting device electrically connected to the thin-film transistor.

The organic material may be a low-viscosity material having a viscosity greater than about 1 cP and equal to or less than about 100 cP.

The organic material may be formed of an imide-based, acrylic-based, phenylene-based, or siloxane-based material.

The barrier layer may have a thickness equal to or greater than about 10 nm and equal to or less than about 1 μm.

The flexible display apparatus may further include: a protective film on a surface opposite to a surface on which the display unit is on the barrier layer.

These general and specific embodiments may be implemented by using a system, a method, a computer program, or a combination of the system, the method, and the computer program.

Another aspect is a method of manufacturing a flexible display, the method comprising: forming a sacrificial metal layer over a support substrate, the sacrificial metal layer formed of a metal material; forming a barrier layer over the sacrificial metal layer, the barrier layer formed of an organic material; exposing the sacrificial metal layer to oxygen so as to form a sacrificial metal oxide layer; forming a display unit over the barrier layer, and separating the barrier layer from the support substrate.

In the above method, the organic material has a viscosity greater than about 1 cP and equal to or less than about 100 cP.

In the above method, the barrier layer is formed of an imide-based, acrylic-based, phenylene-based, or siloxane-based material.

In the above method, the barrier layer has a thickness equal to or greater than about 10 nm and equal to or less than about 1 μm.

In the above method, the sacrificial metal layer is formed of molybdenum (Mo).

In the above method, the forming of the barrier layer comprises concurrently vaporizing the solvent from the organic material and forming the sacrificial metal oxide layer.

In the above method, the barrier layer is additionally formed of a cross-linking agent, wherein the method further comprises concurrently heating the barrier layer and forming the sacrificial metal oxide layer so as to cross-link the barrier layer with the cross-linking agent.

In the above method, the separating comprises radiating a laser beam onto the sacrificial metal oxide layer.

In the above method, the separating comprises dissolving the sacrificial metal oxide layer in water.

In the above method, the sacrificial metal oxide layer is formed after the barrier layer is formed.

Another aspect is a flexible display comprising: a barrier layer formed of an organic material where the barrier layer includes first and second surfaces opposing each other; and a display unit over the first surface of the barrier layer and comprising a thin-film transistor (TFT) and a light-emitting device (LED) electrically connected to the TFT.

The above flexible display further comprises a protective film over the second surface of the barrier layer.

In the above flexible display, the organic material has a viscosity greater than about 1 cP and equal to or less than about 100 cP.

The above flexible display further comprises a protective film over the second surface of the barrier layer.

In the above flexible display, the organic material includes an imide-based, acrylic-based, phenylene-based, or siloxane-based material.

The above flexible display further comprises a protective film over the second surface of the barrier layer.

In the above flexible display, the barrier layer has a thickness equal to or greater than about 10 nm and equal to or less than about 1 µm.

The above flexible display further comprises a protective film over the second surface of the barrier layer.

Another aspect is a method of manufacturing a flexible display, the method comprising: depositing a metal over a support substrate so as to form a sacrificial metal layer; depositing an organic material over the sacrificial metal layer so as to form a barrier layer; exposing the sacrificial metal layer to oxygen so as to form a sacrificial metal oxide layer in a chamber, and separating the barrier layer from the support substrate.

The above method further comprises forming a protective film over the barrier layer after the separating.

DETAILED DESCRIPTION OF EXEMPLARY EMBODIMENTS

A glass substrate is generally used to manufacture a flexible substrate. However, a flexible substrate formed of a material such as synthetic resin has been used recently to implement a flexible display. Since the flexible substrate can easily bend, it may be difficult to handle the flexible substrate in a manufacturing process. Accordingly, a flexible substrate is formed on a support substrate having sufficient rigidity, several processes are performed, and then, the flexible substrate is separated from the support substrate.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items.

As the described technology allows for various changes and numerous embodiments, particular embodiments will be illustrated in the drawings and described in detail in the written description. Effects and features of the described technology and a method of achieving the same will become apparent to those skilled in the art from the following detailed description which discloses various embodiments of the present disclosure in con junction with the annexed drawings. The described technology may, however, be embodied in many different forms and should not be construed as being limited to the embodiments set forth herein.

Hereinafter, the described technology will be described in detail by explaining embodiments with reference to the attached drawings Like reference numerals in the drawings denote like elements, and thus their descriptions will not be repeated.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

FIGS. 1 through 3 and FIG. 5 illustrate schematic diagrams of a process of manufacturing a flexible display apparatus according to an exemplary embodiment. FIG. 4 is a schematic magnified cross-sectional view of a structure of a display unit shown in FIG. 3.

Figure 1:
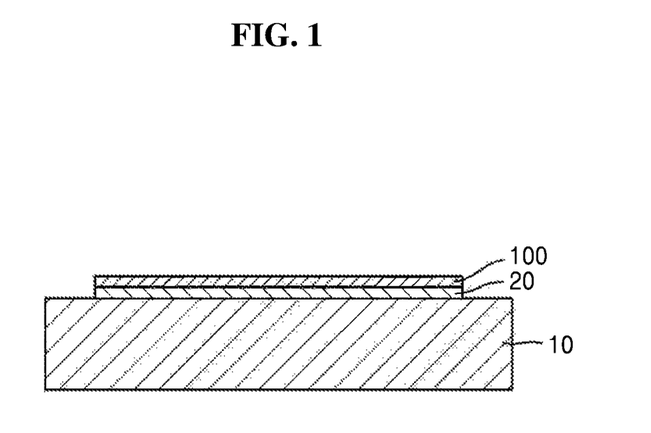
FIGS. 1, 2, 3 and 5 illustrate schematic diagrams of a process of manufacturing a flexible display apparatus according to an exemplary embodiment.

Referring to FIG. 1, a sacrificial metal layer 20 is formed on a support substrate 10, and then, a barrier layer 100 including an organic material may be formed on the sacrificial metal layer 20. The support substrate 10 may be formed of various materials having sufficient rigidity, such as glass or metal. In the current embodiment, since the flexible display apparatus is flexible, the support substrate 10 supports the flexible display apparatus while various layers that are to be described later are formed on the barrier layer 100.

The sacrificial metal layer 20 may be formed on the support substrate 10. The sacrificial metal layer 20 may be formed on the support substrate 10 by using a deposition method or other various methods. The sacrificial metal layer 20 may include a metal material and may be formed of, for example, molybdenum (Mo) by taking into account an adhesive force with respect to the support substrate 10 and a stripping process. However, exemplary embodiments are not limited thereto. The sacrificial metal layer 20 may be removed in a subsequent process to separate a display unit 200 from the support substrate 10.

The barrier layer 100 may be formed on the sacrificial metal layer 20, and include an organic material. An organic material having a low viscosity may be used as the organic material of the barrier layer 100. Accordingly, the barrier layer 100 may be formed to have a small thickness by using the organic material having a low viscosity. The barrier layer 100 may be formed to have a thickness of several tens of nm to a few μm. The barrier layer 100 may be formed to have a thickness equal to or greater than about 10 nm and equal to or less than about 1 μm. The barrier layer 100 may be formed using various well-known methods in the art, such as a deposition method, a sputtering method, a spin coating method, or the like.

The viscosity of the organic material forming, the barrier layer 100 may be greater than about 1 centipoise (cP) and equal to or less than about 100 cP. Accordingly, the organic barrier layer 100 may be formed to have a thin type, Since the viscosity of the organic material is greater than about 1 cP, the organic material has a slightly higher viscosity than water, which has a low viscosity of 1 cP. If the viscosity of the organic material is greater than about 100 cP, it may be not easy to form the barrier layer 100 on the support substrate 100 to have the thickness described above.

As described above, the barrier layer 100 may be formed of an organic material having a low viscosity. The barrier layer 100 may be formed of, for example, an imide-based, acrylic-based, phenylene-based, or siloxane-based material, from among organic materials having a low viscosity. The barrier layer 100 is exposed to a high temperature in a subsequent process of forming the display unit 200 or stripping the display unit 200 from the support substrate 10 after forming the display unit 200 as a subsequent process. Accordingly, as described above, the barrier layer 100 may need to be an organic material having a low viscosity and endure a high temperature. Since the above-described materials are strong at a high temperature and may be formed to have a low viscosity, the materials may form the barrier layer 100 in the current embodiment.

According to an exemplary embodiment, the barrier layer 100 may include a solvent in addition to an organic material. Alternately, according to another exemplary embodiment, the barrier layer 100 may include a cross-linking agent in addition to an organic material. If the barrier layer 100 includes a solvent, the barrier layer 100 may be hardened while the solvent is vaporized.

Figure 2:
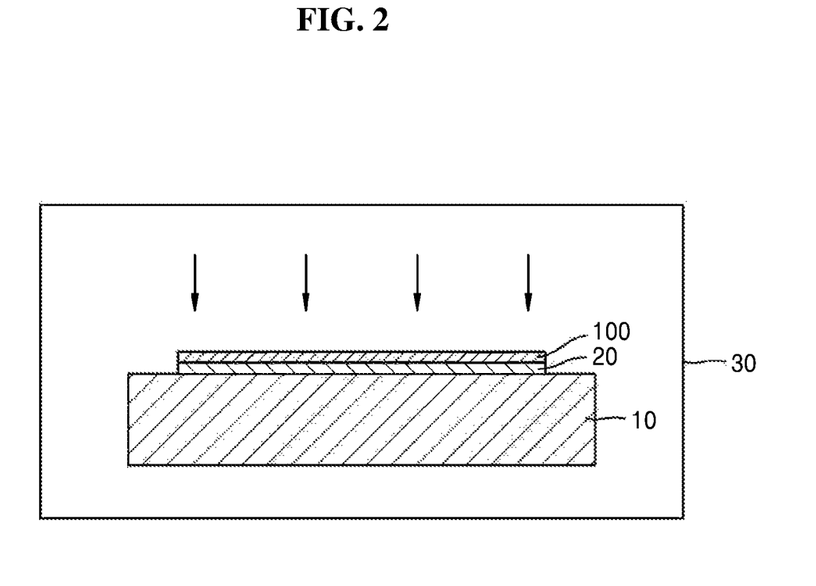

Referring to FIG. 2, after the sacrificial metal layer 20 and the barrier layer 100 are formed on the support substrate 10, a subsequence processing process may be performed in a chamber 30. A sacrificial metal oxidation layer 20' may be formed by establishing an atmosphere of oxygen ($O_2$) in the chamber 30. For example, metal oxide may be formed by exposing the sacrificial metal layer 20 to $O_2$ so as to combine metal with $O_2$. Various types of metal oxides may be used as a metal oxide. A metal oxide may be, for example, molybdenum oxide (MoOx), but is not limited thereto.

Additionally, heat processing may be performed in the chamber 30. If the barrier layer 100 contains a cross-linking agent, the barrier layer 100 may be exposed to heat so that the organic material is cross-linked with the cross-linking agent. The barrier layer 100 may be hardened by using such a process. Additionally, the sacrificial metal layer 20 may be formed as the sacrificial metal oxide layer 20' and the organic material may be cross-linked with a cross-linking agent, by applying O.sub.2 and beat to the sacrificial metal layer 20 in the chamber 20. Thus, processing time may be reduced and a process may be simplified.

Figure 3:
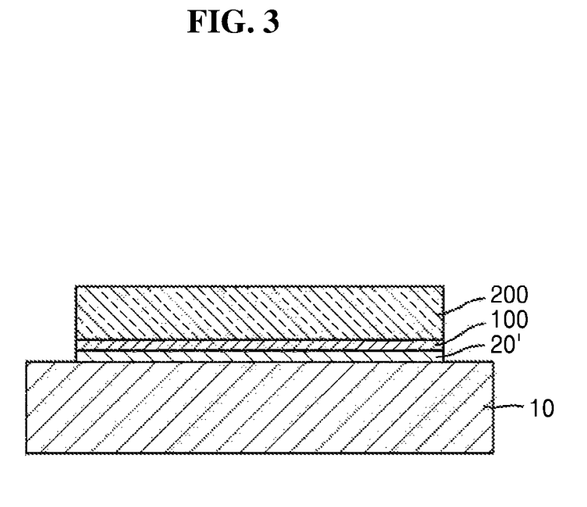
Figure 4:
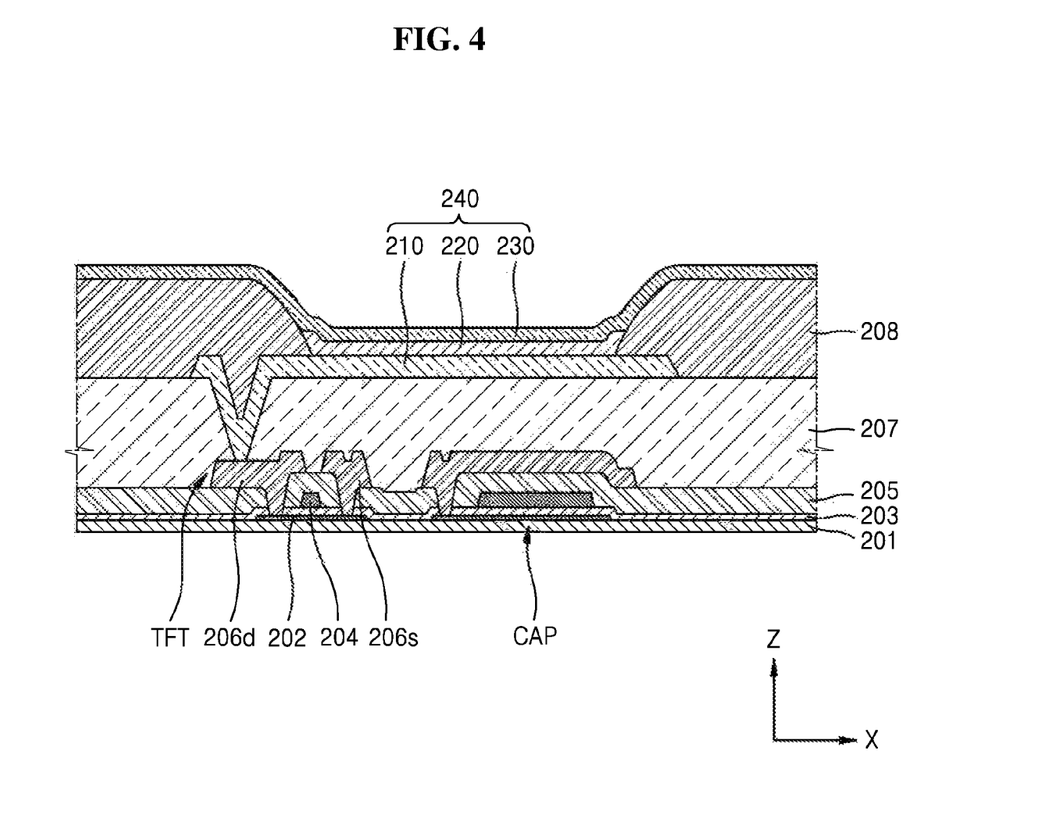
FIG. 4 is a schematic magnified cross-sectional view of a structure of a display unit shown in FIG. 3.

Referring to FIGS. 3 and 4, the display unit 200 may be formed on the barrier layer 100.

The display unit 200 may include a thin-film transistor TFT and a capacitor CAP which are disposed on the buffer layer 201, and include a light-emitting device 240 electrically connected to the thin-film capacitor TFT. The light-emitting device 240 may be a liquid-crystal light-emitting device or an organic light-emitting device (OLED). In the current embodiment, a case when an OLED is included is described.

The display unit 200 may be formed of a plurality of pixels. Each of the plurality of pixels may be electrically connected to the thin-film transistor TFT so as to control whether to emit light or a degree of light-emitting. Thus, the display unit 200 may display an image to outside. FIG. 4 is a schematic magnified cross-sectional view of a structure of a single pixel included in the display unit 200.

Referring to FIG. 4, the display unit 200 may be generally formed by stacking layers in a certain order. A buffer layer 201 may be formed of silicon oxide, silicon nitride, or the like on the barrier layer 100, so as to planarize a surface of the barrier layer 100 or prevent impurities from penetrating into a semiconductor layer 202 of the thin-film transistor TFT. The semiconductor layer 202 may be patterned on the buffer layer 201.

A gate electrode 204 is formed on the semiconductor layer 202. A source electrode 206s and a drain electrode 206d are electrically conducted to each other according to a signal applied to the gate electrode 204. The gate electrode 204 may be formed of one from among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) to form a single layer or multiple layers, by taking into account adhesion to adjacent layers, planarizability, and fabricability.

A gate insulating layer 203 formed of silicon oxide and/or silicon nitride may be interposed between the semiconductor layer 202 and the gate electrode 204, so as to ensure insulation between the semiconductor layer 202 and the gate electrode 204.

An interlayer insulating layer 205 may be formed on the gate electrode 204. The interlayer insulating layer 205 may be formed of a material such as silicon oxide or silicon nitride to form a single layer or multiple layers.

The source electrode 206s and the drain electrode 206d are formed on the interlayer insulating layer 205. The source electrode 206s and the drain electrode 206d are respectively connected to the semiconductor layer 202 via a contact hole respectively formed on the interlayer insulating layer 205 and the gate insulating layer 203. The source electrode 206s and the drain electrode 206d are formed of one of Al, Pt, Pd, Ag, Mg, Au, Ni, Nd, Ir, Cr, Li, Ca, Mo, Ti, W, and Cu to form a single layer or multiple layers, by taking into account conductivity.

A planarization layer 207 may be formed on the barrier layer 100. If an OLED is disposed on the thin-film transistor TFT, the planarization layer 206 planarizes a top surface of the thin-film transistor TFT, and protects the thin-film transistor TFT and various devices. The planarization layer 207 may be formed of, for example, an acrylic-based organic material, Benzocyclobutene (BCB), or the like.

A protection layer (not shown) may be further formed below the planarization layer 207 to protect the thin-film transistor TFT and various devices. The protection layer may be formed of, for example, silicon oxide or silicon nitride to form a single layer or multiple layers.

The buffer layer 201, the gate insulating layer 203, and the interlayer insulating layer 205 may be formed on a whole surface of the barrier layer 100.

A pixel electrode 201 may be patterned on the planarization layer 207. The pixel electrode 210 may be electrically connected to the source layer 206s or the drain electrode 206d via a via hole formed on the planarization layer 207.

A pixel-defining layer 208 may be disposed on the thin-film transistor TFT. The pixel-defining layer 208 may be located on the planarization layer 207 described above, and have an opening exposing a center part of the pixel electrode 210. The pixel-defining layer 208 defines a pixel area.

The pixel-defining layer 208 may include, for example, an organic insulating layer. The organic insulating layer may include an acrylic-based polymer such as polymethyl methacrylate (PMMA), polystyrene, a polymer derivative containing a phenol group, an imide-based polymer, an arylether-based polymer, an amide-based polymer, fluorine-based polymer, a p-xylene-based polymer, a vinyl alcohol-based polymer, or a mixture thereof.

An OLED 240 may be formed on the pixel-defining layer 208. The OLED 240 may include a pixel electrode 210, an intermediate layer 220 that includes an emission layer (EML), and an opposite electrode 230.

The pixel electrode 210 may be formed of a transparent electrode, a semitransparent electrode or a reflective electrode. If the pixel electrode 210 is formed of a transparent electrode or a semitransparent electrode, the pixel electrode 210 may be formed of indium tin oxide (ITO), indium zinc oxide (IZO), zinc oxide (ZnO), indium oxide (In.sub.2O.sub.3), indium gallium oxide (IGO), or aluminum zinc oxide (AZO). If the pixel electrode 210 is formed of a reflective electrode, the pixel electrode 210 may include a reflective layer formed of Ag, Mg, Al, Pt, Pd, Au, Ni, Nd, Ir, Cr, or a compound thereof, and a layer formed of ITO, IZO, ZnO, In.sub.2O.sub.3, IGO or AZO. However, exemplary embodiments are not limited thereto. The pixel electrode 210 may be formed of various materials, and modified in various ways such as having a single or multi-layered structure.

The intermediate layer 220 may be respectively on pixel areas defined by the pixel-defining layer 208. The intermediate layer 220 includes an EML emitting light according to an electrical signal, and may be formed by stacking a hole injection layer (HIL) disposed between the EML and the pixel electrode 210, a hole transport layer (HTL), and an electron transport layer (ETL) disposed between the EML and the opposite electrode 230, and an electron injection layer (EIL) in a single or multiple structure. However, the intermediate layer 220 is not limited thereto, and may be formed of various structures.

The opposite electrode 230 may be formed on a whole surface of the barrier layer 100 to cover the intermediate layer 220 that includes the EML and face the opposite electrode 210. The opposite electrode 230 may be formed of a transparent electrode, a semitransparent electrode, or a reflective electrode.

When the opposite electrode 230 is formed of a transparent electrode or a semitransparent electrode, the opposite electrode 230 may include a layer formed of metal with a low work function, that is, Li, Ca, lithium-fluoride-calcium (LiF/Ca), lithium-fluoride-aluminum (LiF/Al), Al, Mg. or a compound thereof and a transparent conductive layer or a semitransparent conductive layer formed of ITO, IZO, ZnO, or $In_2O_3$. If the opposite electrode 230 is formed of a reflective electrode, the opposite electrode 230 may include a layer formed of Li, Ca, LiF/Ca, LiF/Al, Al, Ag, Mg or a compound thereof. However, elements and materials of the opposite electrode 230 are not limited thereto, and various modifications thereof may be made.

Figure 5:
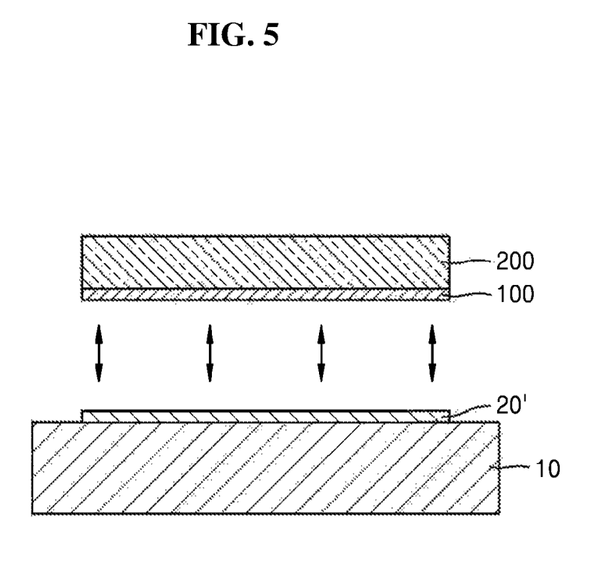

Referring to FIG. 5, the display unit 200 is formed on the barrier layer 100, and then, the barrier layer 100 is separated from the support substrate 10. For example, the barrier layer 100 and the display unit 200 formed on the barrier layer 100 may be separated from the support substrate 10. Although not illustrated, a polarizing plate, a touch screen panel (TSP), or the like may be further formed on the display unit 200. A carrier film may be formed on the display unit 200 to prevent the display unit 200 from being damaged while the display unit 200 is separated from the support substrate 10.

The sacrificial metal oxide layer 20' may be dissolved by moisture and removed so as to the separate the display unit 200 from the support substrate 10. In the current embodiment, if the sacrificial metal oxide layer 20' includes MoOx, the sacrificial metal oxide layer 20' may be dissolved by moisture. Accordingly, the sacrificial metal oxide layer 20' remaining on the barrier layer 100 may be removed completely by dissolving the sacrificial metal oxide layer 20' by moisture.

According to another exemplary embodiment, the removing of the sacrificial metal oxide layer 20' may include removing the sacrificial metal oxide layer 20' by radiating a laser light to the sacrificial metal oxide layer 20' in a direction from the support substrate 10 to the display unit 200. According to cases, the sacrificial metal oxide layer 20' may not be completely removed, and a part thereof may remain on the barrier layer 100. In this case, the sacrificial metal oxide layer 20' may be completely removed by dissolving the sacrificial metal oxide layer 20' remaining on the barrier layer 100 by moisture.

Typically, a display unit is separated from a support substrate by radiating a laser light to a sacrificial layer. In this process, a crack may form in the sacrificial layer and spread to an inorganic layer below the display unit, thus deteriorating a device. Additionally, if a laser light is radiated to the sacrificial layer, the laser light may spread heat to the sacrificial layer, and cause heat deformation of an upper protective film on the display unit 200.

According to an exemplary embodiment, in a method of manufacturing the flexible display apparatus, the barrier layer 100 formed of an organic material is formed between the sacrificial metal layer 20 and the display unit 200 and may prevent a crack from spreading to an inorganic layer below the display unit 200 if a crack is generated in the sacrificial metal oxide layer 20' while a laser light is radiated to the sacrificial metal oxide layer 20' in a process of stripping the display unit 200 from the support substrate 10. Additionally, the barrier layer 100 formed of an organic material may support the display unit 200 from below. Since the barrier layer 100 is formed of an organic material that has a low viscosity and has strong resistance to heat, the barrier layer 100 may be formed in a thin type. Additionally, since the typical thick flexible substrate is not employed, flexibility of the flexible display apparatus may be improved.

After the display unit 200 is separated the support substrate 10, the display unit 200 may appear as being formed on the organic barrier layer 100. Although not shown in FIG. 5, a protective film 300, shown in FIG. 6, may be attached to a surface of the barrier layer 100 in a subsequent process after the barrier layer 100 is separated from the support substrate 10. The protective film 300 may protect a bottom surface of the display unit 200 and the barrier layer 100 and the protective film 300 together may support the display unit 200 in a process performed after the display unit 200 is separated from the support substrate 10.

The method of manufacturing a flexible display apparatus has been mainly described. However, exemplary embodiments are is not limited thereto.

Figure 6:
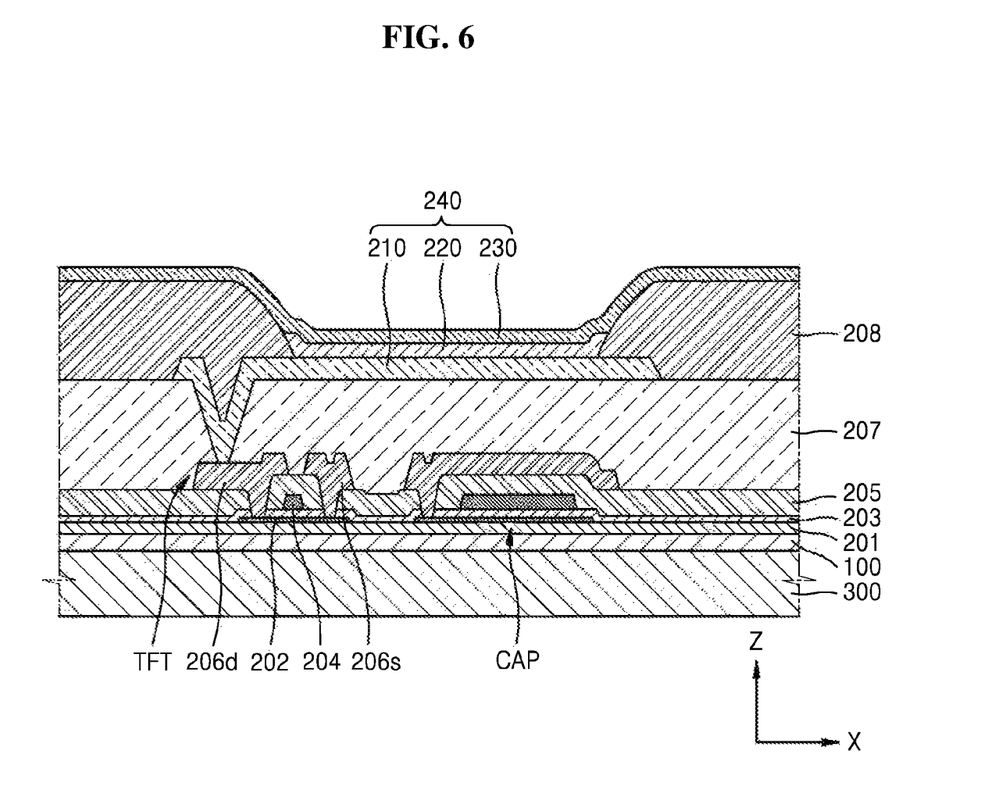
FIG. 6 is a schematic cross-sectional view of the flexible display apparatus according to an exemplary embodiment.

FIG. 6 is a schematic cross-sectional view of the flexible display apparatus according to an exemplary embodiment.

Referring to FIG. 6, according to an exemplary embodiment, the flexible display apparatus includes the protective film 300, the barrier layer 100 that includes an organic material or layer disposed on the protective film 300, and the display unit 200 disposed on the barrier layer 100.

As described with reference to the method of manufacturing a flexible display apparatus, the protective film 300 is attached to the barrier layer 100 after the barrier layer 100 and the display unit 200 are separated from the support substrate 10. Although not illustrated, an adhesive layer may be disposed between the barrier layer 100 and the protective film 300. The protective film 300 may protect a bottom surface of the display unit and the barrier layer 100 and the protective film 300 may support the display unit 200.

The protective film 300 may be formed of a plastic film or a metal foil. If a plastic film is used as the protective film 300, the plastic film may be one of Polyethylene terephthalate (PET), polyether sulfone (PES), polycarbonate (PC), polyethylene naphthalate (PEN), polyallylate (PAR), polyurethane (PU), and polyimide (PI), but is not limited thereto. If a metal foil is selected as the protective film 300, the metal foil may be stainless steel (STS), but is not limited thereto.

The barrier layer 100 may be disposed on the protective film 300. The barrier layer 100 may include an organic material having a low viscosity. If the barrier layer 100 includes an organic material having a low viscosity, the barrier layer 100 may be formed in a thin type. The barrier layer 100 may be formed to have a thickness of tens of nm to a few μm. The barrier layer 100 may be formed to have a thickness equal to or greater than about 10 nm and equal to or less than about 1 μm.

As described above, the barrier layer 100 may include an organic material having a low viscosity and, accordingly, a viscosity of the organic material forming the barrier layer 100 may be greater than about 1 cP and equal to or less than about 100 cP. Since a viscosity of the organic material is greater than about 1 cP, the organic material has a slightly higher viscosity than that of water having a low viscosity, compared to the water having a viscosity of 1 cP. If a viscosity of the organic material is greater than about 100 cP, it may be not easy to form the barrier layer 100 on the support substrate 100 to have the thickness described above.

As described above, the barrier layer 100 may be formed of an organic material having a low viscosity. The barrier layer 100 may be formed of, for example, an imide-based, acrylic-based, phenylene-based, or siloxane-based material, from among organic materials having a low viscosity. The barrier layer 100 is exposed to a high temperature in a process of forming the display unit 200 or stripping the display unit 200 from the support substrate 10 after forming the display unit 200. Accordingly, the barrier layer 100 may need to be an organic material having a low viscosity and endure a high temperature. Since the above-described materials are strong at a high temperature and may be appropriately formed to have a low viscosity, the barrier layer 100 may be formed of the above-described materials in the current embodiment.

Various devices, such as the thin-film transistor TFT and the capacitor CAP, may be disposed on the display unit 200, and the OLED 240 electrically connected to the thin-film transistor TFT may be located in the display unit 200. A description about a pixel structure constituting the display unit 200 is identical to a description provided with reference to FIG. 4, and thus, is not provided here again.

In the display unit 200, a common layer such as the buffer layer 201, the gate insulating layer 201, or the interlayer insulating layer 205 may be disposed on a whole surface of the barrier layer 100, and the patterned semiconductor layer 202 that includes a channel area, a source contact area, and a drain contact area may be disposed in the display unit 200. The thin-film transistor TFT may include the patterned semiconductor 202, the gate electrode 204, the source electrode 206s, and the drain electrode 206d.

Additionally, the planarization layer 207 having a nearly planar surface may be disposed on a whole surface of the barrier layer 100 and cover the thin-film transistor TFT. The OLED 240 may be disposed on the planarization layer 207 and may include the patterned pixel electrode 210, the opposite electrode 230 nearly corresponding to the whole surface of the barrier layer 100, and the intermediate layer 220 that has a multilayered structure, is disposed between the pixel electrode 210 and the opposite electrode 230, and includes an EML. Unlike that shown in FIG. 6, the intermediate layer 220 may be a common layer nearly corresponding to the whole surface of the barrier layer 100, or the intermediate layer 220 may be a pattern layer that is patterned to correspond to the pixel electrode 210. The pixel electrode 210 may be electrically connected to the thin-film transistor TFT via a via hole. The pixel-defining layer 208 may be disposed on the planarization layer 207 to nearly correspond to the whole surface of the barrier layer 100, cover an edge of the pixel electrode 210, and have an opening defining each pixel area.

Typically, the display unit 200 is separated from the support substrate 10 by radiating a laser light to a sacrificial layer. In this process, a crack may form in the sacrificial layer and spread to an inorganic layer below the display unit 200, thus deteriorating a device. Additionally, if a laser light is radiated to the sacrificial layer, the laser light may spread heat to the sacrificial layer, and cause heat deformation of a upper protective film on the display unit 200.

According to an exemplary embodiment, in the method of manufacturing the flexible display apparatus, the barrier layer 100 formed of an organic material is formed between the sacrificial metal layer 20 and the display unit 200. If a crack is generated in the sacrificial metal layer 20 while a laser light is radiated to the sacrificial metal layer 20 in a process of stripping the display unit 200 from the support substrate 10, the barrier layer 100 may prevent the crack from spreading to an inorganic layer below the display unit 200. Additionally, the barrier layer 100 formed of an organic material may support the display unit 200 from below the display unit 200. Since the barrier layer 100 is formed of an organic material that has a low viscosity and is strong at heat, the barrier layer 100 may be formed in a thin type. Additionally, since the typical thick flexible substrate is not employed, flexibility of the flexible display apparatus may be improved.

As described above, according to an exemplary embodiment, a flexible display apparatus in which a damage of a display unit, which is caused by heat or a crack generated in a process of manufacturing the flexible display apparatus, is reduced and a method of manufacturing the same are provided.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

The invention claimed is:

1. A method of manufacturing a flexible display, the method comprising:
    forming a sacrificial metal layer over a support substrate, the sacrificial metal layer formed of a metal material;
    forming a barrier layer over the sacrificial metal layer, the barrier layer formed of an organic material;
    exposing the sacrificial metal layer oxygen so as to form a sacrificial metal oxide layer;
    forming a display unit over the barrier layer; and
    separating the barrier layer from the support substrate,
        wherein the forming of the barrier layer comprises concurrently vaporizing a solvent from the organic material and forming the sacrificial metal oxide layer.

2. The method of claim 1, wherein the organic material has a viscosity greater than 1 centipoise (cP) and equal to or less than 100 cP.

3. The method of claim 1, wherein the barrier layer is formed of an imide-based, acrylic-based, phenylene-based, or siloxane-based material.

4. The method of claim 1, wherein the barrier layer has a thickness equal to or greater than 10 nm and equal to or less than 1 μm.

5. The method of claim 1, wherein the sacrificial metal layer is formed of molybdenum (Mo).

6. The method of claim 1,
    wherein the barrier layer is additionally formed of a cross-linking agent, and
    wherein the method further comprises concurrently heating the harrier layer and forming the sacrificial metal oxide layer so as to cross-link the harrier layer with the cross-linking agent.

7. The method of claim 1, wherein the separating comprises radiating a laser beam onto the sacrificial metal oxide layer.

8. The method of claim 1, wherein the separating comprises dissolving the sacrificial metal oxide layer in water.

9. The method of claim 1, wherein the sacrificial metal oxide layer is formed after the harrier layer is formed.

10. A method of manufacturing a flexible display, the method comprising:
    depositing a metal over a support substrate so as to form a sacrificial metal layer;
    depositing an organic material over the sacrificial metal layer so as to form a barrier layer, wherein the barrier layer is additionally formed of a cross-linking agent;
    exposing the sacrificial metal layer to oxygen so as to form a sacrificial metal oxide layer in a chamber and concurrently heating the barrier layer and forming the sacrificial metal oxide layer so as to cross-link the barrier layer with the cross-linking agent, and
    separating the barrier layer from the support substrate.

11. The method of claim 10, further comprising forming a protective film over the barrier layer after the separating.

* * * * *